(12) United States Patent
Hsieh et al.

(10) Patent No.: US 10,062,815 B1
(45) Date of Patent: Aug. 28, 2018

(54) LIGHT EMITTING DEVICE AND METHOD OF MANUFACTURING THE SAME

(71) Applicant: UNISTARS CORPORATION, Zhudong Township (TW)

(72) Inventors: Hsin-Hsien Hsieh, Taoyuan (TW); Shang-Yi Wu, Hsinchu (TW)

(73) Assignee: UNISTARS CORPORATION, Zhudong Township (TW)

( * ) Notice: Subject to any disclaimer, the term of this patent is extended or adjusted under 35 U.S.C. 154(b) by 0 days.

(21) Appl. No.: 15/673,402

(22) Filed: Aug. 9, 2017

(30) Foreign Application Priority Data

Feb. 24, 2017 (TW) .............................. 106106289 A

(51) Int. Cl.
| H01L 33/48 | (2010.01) |
| H01L 33/58 | (2010.01) |
| H01L 33/62 | (2010.01) |

(52) U.S. Cl.
CPC ............ *H01L 33/486* (2013.01); *H01L 33/58* (2013.01); *H01L 33/62* (2013.01); *H01L 2933/0033* (2013.01); *H01L 2933/0058* (2013.01); *H01L 2933/0066* (2013.01)

(58) Field of Classification Search
CPC ....... H01L 33/486; H01L 33/62; H01L 33/58; H01L 2933/0066; H01L 2933/0058; H01L 2933/0033; H01L 23/564
See application file for complete search history.

(56) References Cited

U.S. PATENT DOCUMENTS

2005/0127488 A1* 6/2005 Evans ..................... H01L 23/04
257/680

* cited by examiner

*Primary Examiner* — Roy Potter
*Assistant Examiner* — Paul Patton
(74) *Attorney, Agent, or Firm* — Ding Yu Tan

(57) ABSTRACT

A light emitting device includes a carrier, a light emitting chip, and a covering part disposed on the carrier. The carrier includes a board, a guiding metal layer, and a sealing material. The board has a first surface, a second surface, and a through vent that is divided into a first partial hole and a second partial hole. The first partial hole extends from the first surface to the second partial hole, and the second partial hole extends from the second surface to the first partial hole. The guiding metal layer is formed on the second surface and in the second partial hole, and covers the sidewall of the second partial hole. The guiding metal layer extends from the second partial hole to the second surface, and does not cover the sidewall of the first partial hole and the first surface. The sealing material seals the second partial hole.

19 Claims, 6 Drawing Sheets

LIGHT EMITTING DEVICE AND METHOD OF MANUFACTURING THE SAME

FIELD OF THE INVENTION

The present invention relates to a light emitting device and a method of manufacturing the same, and more particularly to a light emitting device having a through vent and a method of manufacturing the same.

BACKGROUND OF THE INVENTION

In a conventional light emitting diode (LED) package, especially UV LED, having a cavity, the cavity has to be sealed for insulating the LED die, and the cavity is kept vacuum or noble gas atmosphere in order to prevent the LED die within the cavity from suffering damage issue caused by water vapor. Thus, the method of manufacturing the conventional LED package needs a large vacuum chamber to make a vacuum environment for exhausting the air that surrounds the LED die. However, the cost of the large vacuum chamber is very high, whereas the large vacuum chamber needs to spend a lot of time (pulling vacuum so as to be) changing the operating environment within the large vacuum chamber from the atmospheric pressure to an appropriate vacuum. Therefore, generally, it will spend much time and money manufacturing the LED package.

SUMMARY OF THE INVENTION

The invention provides a light emitting device which has a through vent for exhausting the air within the cavity where the light emitting chip is located.

The invention also provides a method of manufacturing the light emitting device. The method applies the through vent for sealing the light emitting chip within the cavity, so as to prevent the light emitting chip from the contact of water vapor.

According to an embodiment of the present invention, the light emitting device includes a carrier, a light emitting chip, and a covering part. The carrier includes a board, a guiding metal layer, a sealing material, and a wiring layer. The board has a first surface, a second surface opposite to the first surface, and a through vent. The through vent is divided into a first partial hole and a second partial hole connected to the first partial hole. The first partial hole extends from the first surface to the second partial hole, whereas the second partial hole extends from the second surface to the first partial hole. The guiding metal layer is formed on the second surface and in the second partial hole, and covers the sidewall of the second partial hole. The guiding metal layer extends from the second partial hole to the second surface and does not cover the first surface and the sidewall of the first partial hole. The sealing material fills and seals the second partial hole. The guiding metal layer surrounds the sealing material. The wiring layer is formed on the first surface. The light emitting chip is mounted on the first surface and connected to the wiring layer. The covering part is disposed on the carrier. A cavity is formed between the covering part and the board, and the light emitting chip is located within the cavity.

In an embodiment of the invention, the second partial hole has a concave and a connective hole. The concave extends from the second surface to the connective hole, whereas the connective hole extends from the bottom of concave to the first partial hole.

In an embodiment of the invention, the guiding metal layer covers the sidewall of the connective hole and the sidewall of the concave.

In an embodiment of the invention, the sealing material touches the guiding metal layer.

In an embodiment of the invention, the sealing material is metal.

In an embodiment of the invention, the covering part includes a covering plate and a supporting frame, and the covering part and the board define the cavity.

In an embodiment of the invention, the carrier includes a supporting frame. The supporting frame protrudes from the first surface, and surrounds the light emitting chip. The supporting frame is fixed between the board and the covering part.

In an embodiment of the invention, the covering part includes a covering plate and a supporting frame. The supporting frame surrounds the light emitting chip and is fixed between the board and the covering plate.

In an embodiment of the invention, the covering plate is transparent.

In an embodiment of the invention, the covering plate is opaque.

In an embodiment of the invention, the light emitting chip is an infrared light source, a visible light source, or an ultraviolet light source.

In an embodiment of the invention, the light emitting device further includes inert gas. The inert gas fills the cavity and is selected from the group consisting of noble gas and nitrogen.

In an embodiment of the invention, a vacuum is formed in the cavity.

In a method of manufacturing the light emitting device according to another embodiment of the present invention, first, a carrier having a first surface, a second surface opposite to the first surface, a through vent extending from the first surface to the second surface, and a guiding metal layer is provided. The guiding metal layer extends from the inside of the through vent to the second surface. Afterward, a light emitting chip is mounted on the first surface. And then a filling metal material is formed on the guiding metal layer but does not seal the through vent. After the light emitting chip is mounted on the first surface, a covering part is disposed on the carrier. A cavity is formed between the covering part and the carrier, and the light emitting chip is located within the cavity. Afterward, the gas within the cavity is exhausted via the through vent at the second surface. Afterward, the filling metal material is heated to melt and flow along the guiding metal layer to the through vent. The filling metal material is solidified at a later time, so that the filling metal material becomes a sealing material that seals the through vent.

In an embodiment of the invention, exhausting the gas from the cavity includes placing the carrier and the covering part in a vacuum environment inside a vacuum chamber.

In an embodiment of the invention, after exhausting the gas from the cavity, an inert gas is pumped into the vacuum chamber, so that the inert gas enters the cavity via the through vent in the second surface.

In an embodiment of the invention, wherein the inert gas fills the cavity while the filling metal material is solidified. In an embodiment of the invention, when the filling metal material is solidifies, a vacuum is formed in the cavity.

In an embodiment of the invention, the carrier is inverted to cause the second surface thereof to face upward before melting the filling metal material.

Consequently, the air within the cavity of the light emitting device can be exhausted via the through vent, and the sealing material can seal the through vent, and prevent the light emitting chip from the contact of water vapor, thereby protecting the light emitting chip from damage caused by water vapor.

BRIEF DESCRIPTION OF THE DRAWINGS

The present invention will become more readily apparent to those ordinarily skilled in the art after reviewing the following detailed descriptions and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
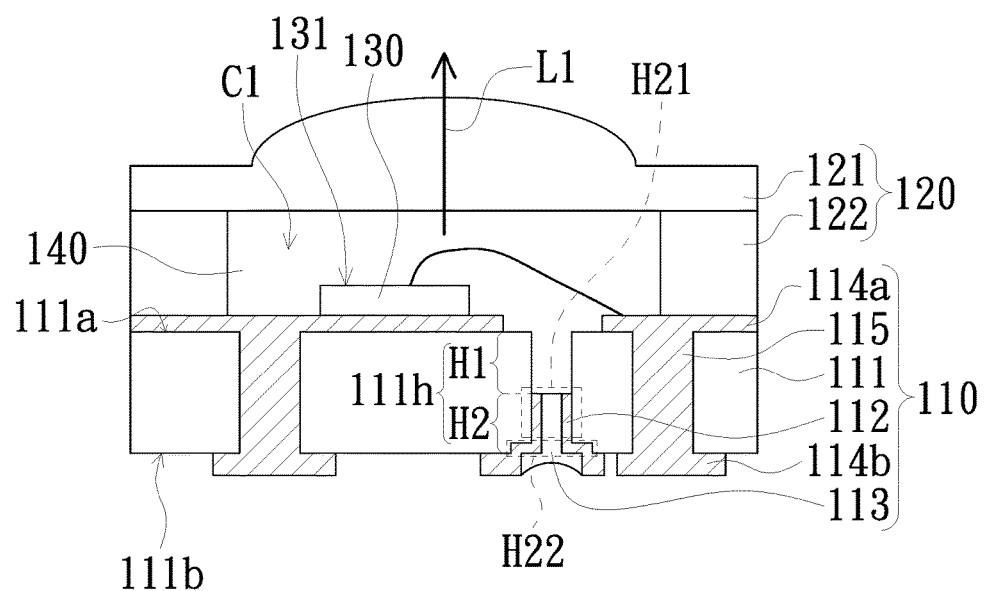
FIG. 1 is a cross-sectional view of a light emitting device according to an embodiment of the present invention.

Referring to FIG. 1, the light emitting device 100 includes a carrier 110 and a light emitting chip 130. The carrier 110 may be a circuit board, such as a Printed Circuit Board (PCB). Taking FIG. 1 for example, the carrier 110 includes a board 111 and a plurality of wiring layers 114a and 114b. The board 111 may be made of resin or ceramic. The board 111 has a first surface 111a and a second surface 111b opposite to the first surface 111a, and the wiring layers 114a and 114b are formed on the first surface 111a and the second surface 111b respectively. Therefore, in the embodiment as illustrated in FIG. 1, the carrier 110 is a double-sided circuit board. However, in other embodiment, the carrier 110 may be a single-sided circuit board or a multilayer circuit board. That is, the number of the wiring layer that the carrier 110 includes may be only one or at least three.

The light emitting chip 130 may be an LED die. In addition, the light L1 emitted by the light emitting chip 130 may be infrared light (IR), visible light or ultraviolet light (UV). Thus, the light emitting chip 130 can be an infrared light source, a visible light source, or an ultraviolet light source. The light emitting chip 130 is mounted on the carrier 110. Taking FIG. 1 for example, the light emitting chip 130 can be mounted on the first surface 111a of the carrier 110 by wire bonding and electrically-connected to the wiring layer 114a. Certainly, the light emitting chip 130 also can be mounted on the carrier 110 by other means, such as flip-chip methodology. Furthermore, the carrier 110 may include only one conductive plug 115 or a plurality of conductive plugs 115, and all of the conductive plugs 115 are formed in the board 111 and connected to the wiring layers 114a and 114b, so that both the wiring layers 114a and 114b can be electrically-connected to each other.

The carrier 110 further includes a guiding metal layer 112. The board 111 further has a through vent 111h extending from the first surface 111a to the second surface 111b of the board 111, and the guiding metal layer 112 is formed on the second surface 111b and in a part of the through vent 111h. The through vent 111h is divided into a first partial hole H1 and a second partial hole H2 that is connected to the first partial hole H1. The first partial hole H1 extends from the first surface 111a to the second partial hole H2, whereas the second partial hole H2 extends from the second surface 111b to the first partial hole H1. The guiding metal layer 112 is formed in the second partial hole H2. The guiding metal layer 112 covers the sidewall of the second partial hole H2 and does not cover the first surface 111a and the sidewall of the first partial hole H1. In other words, the guiding metal layer 112 extends from the inside of the through vent 111h to the second surface 111b. Therefore, the guiding metal layer 112 is just formed on one side of the board 111 (i.e. the second surface 111b) and a part of the through vent 111h (i.e. the second partial hole H2).

In the embodiment as FIG. 1, the second partial hole H2 may have a connective hole H21 and a concave H22, and the diameter of concave H22 is clearly larger than the diameter of hole H21. The concave H22 extends from the second surface 111b to the connective hole H21, whereas the connective hole H21 extends from the bottom of the concave H22 to the first partial hole H1. Hence, the diameter of second partial hole H2 cannot be constant. The guiding metal layer 112 covers the sidewall of the connective hole H21 and the sidewall of the concave H22. Taking FIG. 1 for example, the guiding metal layer 112 may cover all of the surfaces of both the connective hole H21 and the concave H22 entirely, but not cover any surface of the first partial hole H1. In addition, the through vent 111h can be formed by at least one of mechanical drilling and laser drilling, whereas the guiding metal layer 112 can be formed by electro-plating or sputtering. The carrier 110 further includes a sealing material 113 which may be a metallic material, such as tin paste. The sealing material 113 fills a part or portion of the through vent 111h for sealing the through vent 111h. Specifically, the sealing material 113 fills the second partial hole H2 to seal the second partial hole H2. The sealing material 113 touches the guiding metal layer 112, and the guiding metal layer 112 surrounds the sealing material 113, as shown in FIG. 1. Moreover, the melting point of the sealing material 113 is higher than a working temperature of the light emitting chip 130. For example, when the light emitting chip 130 is working or operating, the working/operating temperature of the light emitting chip 130 can reach about 150° C., and the tin paste which can be used as the sealing material 113 has a melting point of about 220° C., which is higher than the working/operating temperature of the light emitting chip 130 at about 150° C. Since the melting point of the sealing material 113 is higher than the working/operating temperature of the light emitting chip 130, the heat generated by the light emitting chip 130 during operation is difficult to melt the sealing material 113.

The light emitting device 100 further includes a covering part 120 which is disposed and fixed on the carrier 110. A cavity C1 is formed between the covering part 120 and the board 111. The light emitting chip 130 is located within the cavity C1, and the through vent 111h is connected to the cavity C1. In the embodiment as shown in FIG. 1, the covering part 120 may include a covering plate 121 and a supporting frame 122. The supporting frame 122 surrounds the light emitting chip 130, and is fixed between the board 111 and the covering plate 121, in which the method of fixing the supporting frame 122 between the board 111 and covering plate 121 can be gluing or eutectic bonding. The covering plate 121 and the supporting frame 122 define a holding recess (not shown in FIG. 1), and the cavity C1 is defined by the holding recess and the board 111, Accordingly, the cavity C1 can be formed between the covering part 120 and the board 111.

In the embodiment as shown in FIG. 1, the covering plate 121 may be transparent. For example, the covering plate 121 can be made of a transparent material, such as glass or polymethylmethacrylate (PMMA, i.e. Acrylic). Moreover, the covering plate 121 may further have a function of converging or diverging light. Taking FIG. 1 as example, the covering plate 121 has a structure of a convex lens to converge the light L1 emitted from the light emitting chip 130. However, in other embodiment, the covering plate 121 may have no function of converging or diverging light. Thus, the covering plate 121 can be a glass plate with two flat sides. Additionally, although the covering plate 121 in the embodiment of FIG. 1 is transparent, the covering plate 121 also may be opaque in other embodiment.

In the embodiment as illustrated in FIG. 1, the light emitting device 100 may further include an inert gas 140 filling the cavity C1. The inert gas 140 is a gas that cannot damage the light emitting chip 130, and is selected from a group consisting of noble gas and nitrogen. Alternatively, the inert gas 140 may include noble gas and nitrogen. Although the through vent 111$h$ and the cavity C1 are connected, the sealing material 113 can seal the through vent 111$h$ so that the water vapor cannot enter the cavity C1, thereby keeping/sustaining the cavity C1 in a noble gas atmosphere, a nitrogen atmosphere, or an atmosphere where nitrogen and noble gas are mixed for preventing the light emitting chip 130 from the contact of water vapor. Therefore, the light emitting chip 130 cannot be damaged by the contact of the water vapor. Moreover, in other embodiment, a vacuum can be formed in the cavity C1, so that there can be no gas filling the cavity C1.

FIGS. 2A to 2E are cross-sectional views of a plurality of steps of a method of manufacturing the light emitting device in FIG. 1. Referring to the FIG. 2A, in the method of manufacturing the light emitting device 100 according to the embodiment, first, the carrier 110 including the guiding metal layer 112 is provided. Afterward, the light emitting chip 130 is mounted on the first surface 111$a$ of the board 111. For example, the light emitting chip 130 can be mounted on the first surface 111$a$ of the board 111 by wire bonding or flip-chip.

Figure 2A:
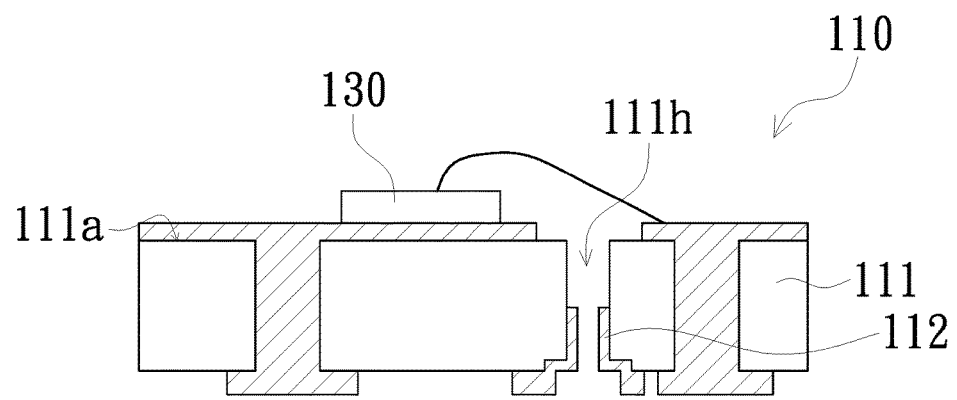
FIGS. 2A to 2E are cross-sectional views of corresponding steps for a method of manufacturing the light emitting device in FIG. 1.
Figure 2B:
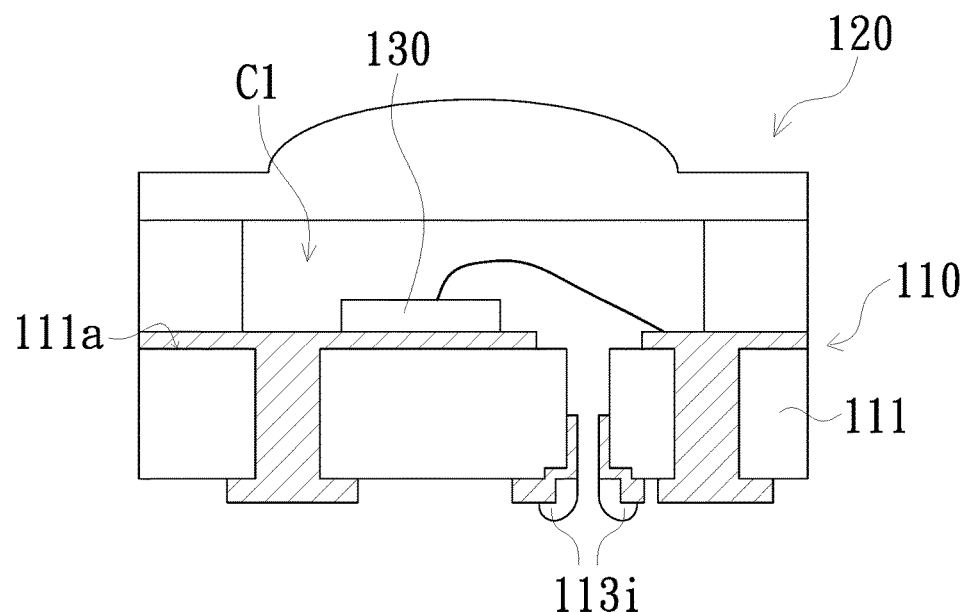

Referring to FIG. 2B, after the light emitting chip 130 is mounted on the first surface 111$a$ of the board 111, the covering part 120 is disposed on the carrier 110, so as to form a cavity C1 between the covering part 120 and the carrier 110, where the light emitting chip 130 is located within the cavity C1. Disposing the covering part 120 on the carrier 110 includes a variety of methods, such as gluing or eutectic bonding. In addition, the step of disposing the covering part 120 on the carrier 110 is performed under atmospheric environment and is different from the method of manufacturing the conventional LED package. Based on the conventional method of manufacturing the conventional LED package, the step of disposing the covering part 120 on the carrier 110 is performed under a vacuum environment, so that a large vacuum chamber is needed to perform conventional LED package. Therefore, compared with prior art, the step of disposing the covering part 120 on the carrier 110 according to the embodiments of present invention can be performed under atmospheric environment, and not performed under the vacuum environment/condition within the large vacuum chamber.

Afterward, a filling metal material 113$i$ is formed on the guiding metal layer 112. The filling metal material 113$i$ may be tin paste, and the filling metal material 113$i$ is melted to become the sealing material 113 for sealing the through vent 111$h$ (referring to FIG. 2E) as shown in the subsequent step of the method of manufacturing the light emitting device. However, the filling metal material 113$i$ does not seal the through vent 111$h$ at the same time, as shown in FIG. 2B. In addition, it is appropriate to form the filling metal material 113$i$ after the covering part 120 is disposed on the carrier 110 by eutectic bonding, so as to avoid the melted the filling metal material 113$i$ jamming the through vent 111$h$ during the eutectic bonding.

Figure 2C:
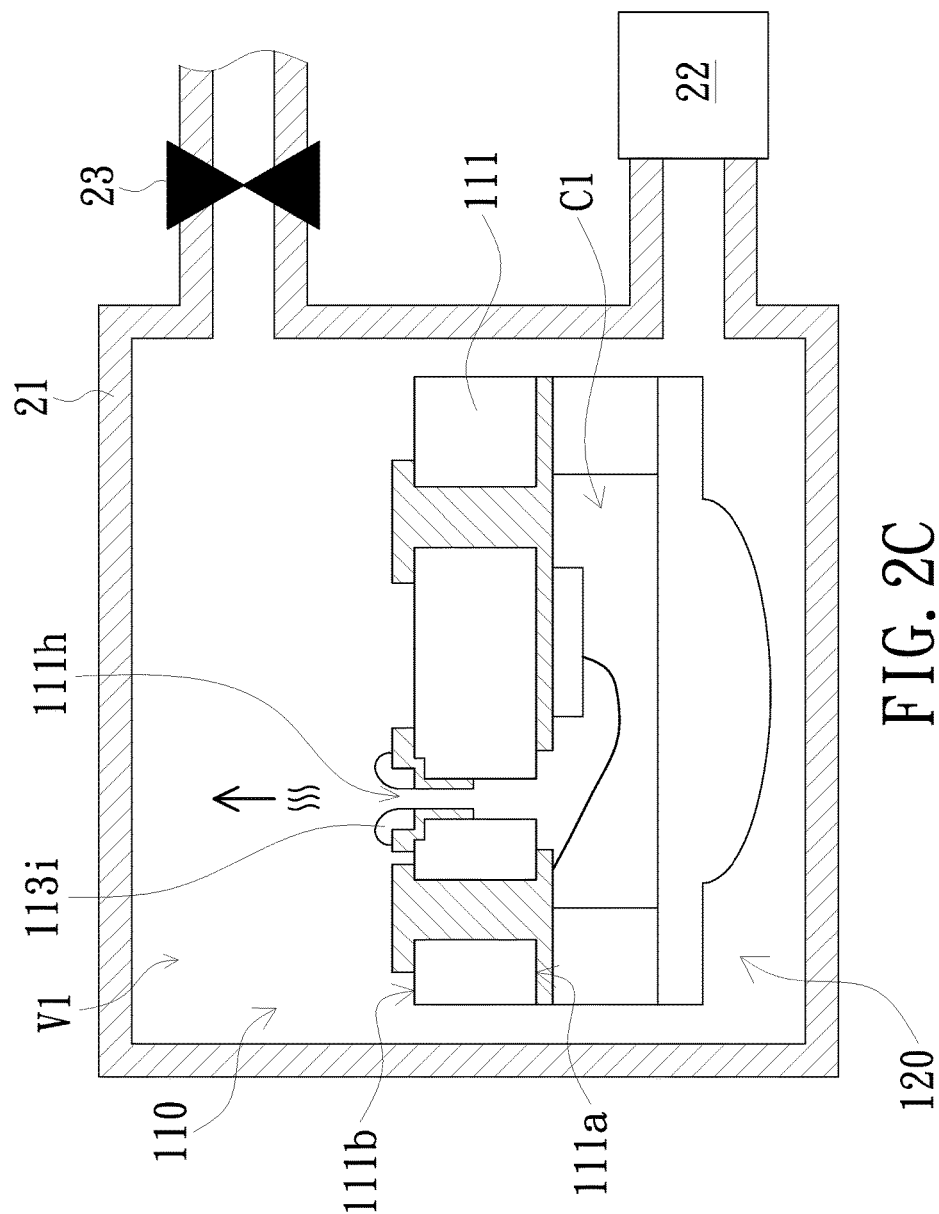

Referring to FIG. 2C, afterward, the gas (e.g. air) within the cavity C1 is exhausted via the through vent 111$h$ in the second surface 111$b$ of the board 111. In detail, after the covering part 120 is disposed on the carrier 110, the carrier 110 and the covering part 120 are placed in a vacuum environment V1 formed within a vacuum chamber 21 which can be connected to a pump 22 and a valve 23. In addition, when the carrier 110 and the covering part 120 are placed in the vacuum environment V1, the carrier 110 can be inverted. That is, the second surface 111$b$ of the board 111 faces upward, whereas the covering part 120 faces downward.

The valve 23 may be connected to at least one gas cylinder (not shown), which contains noble gas or nitrogen. Alternatively, the valve 23 may be connected to two gas cylinders, which contain noble gas and nitrogen, respectively. The valve 23 can control the entrance of the gas from the gas cylinder (e.g. noble gas or nitrogen) to the vacuum chamber 21. Moreover, in FIG. 2C to FIG. 2E, the "blackened in" valve 23 denotes the closed valve 23, which can stop the gas supplied by the gas cylinder from entering the vacuum chamber 21. The "blank/unfilled" valve 23 denotes the opened valve 23, which can allow the gas from the gas cylinder to enter the vacuum chamber 21.

The pump 22 may be, for example, a rotary vane pump, and the pressure in the vacuum environment V1 ranges below about $10^{-3}$ torr. However, the vacuum chamber 21 may be connected to an additional pump, which may be a turbo pump, and the pressure in the vacuum environment V1 ranges between $10^{-3}$ torr and $10^{-6}$ torr. The through vent 111$h$ is connected to the cavity C1, and the filling metal material 113$i$ does not seal the through vent 111$h$, so that the gas within the cavity C1 can be exhausted to the vacuum environment V1 via the through vent 111$h$ in the second surface 111$b$, and then the pump 22 pumps the gas to outside atmosphere.

Figure 2D:
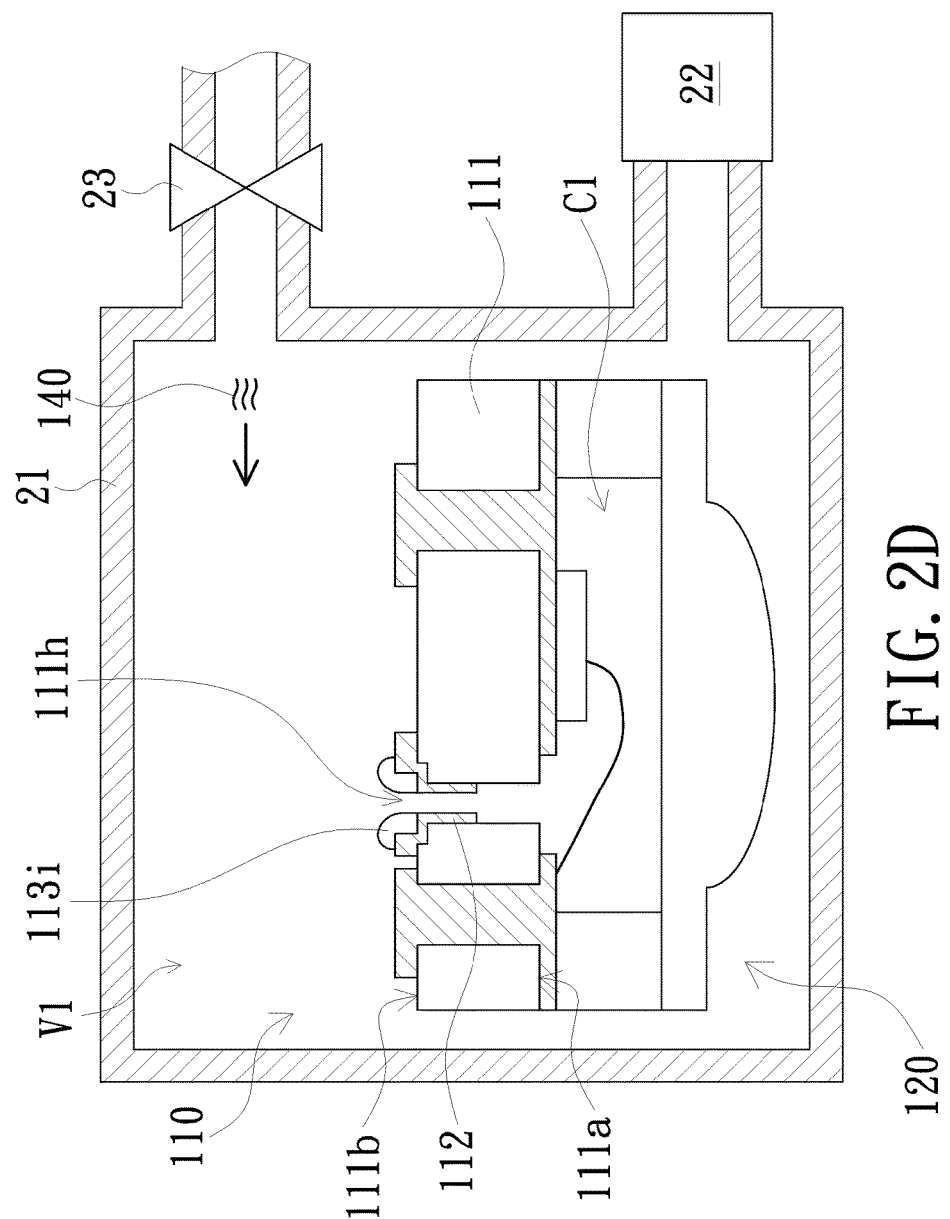
Figure 2E:
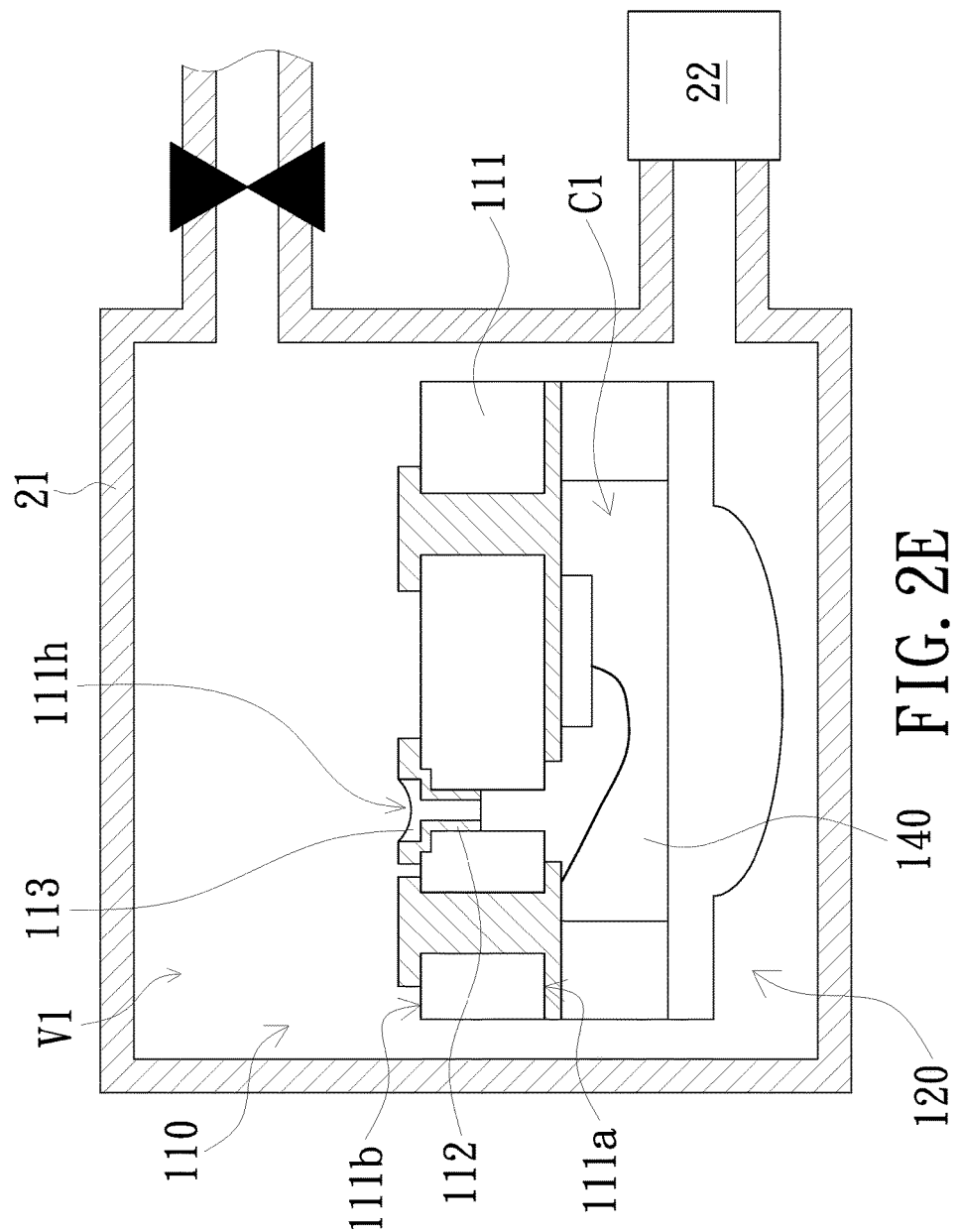

Referring to FIG. 2D, after exhausting the gas within cavity C1, the valve 23 is opened, and the inert gas 140 is pumped into the vacuum chamber 21, so that the inert gas 140 can enter the cavity C1 via the through vent 111$h$ in the second surface 111$b$. Referring to FIG. 2D and FIG. 2E, afterward, the filling metal material 113$i$ is melted to cause the filling metal material 113$i$ to flow along the guiding metal layer 112 to the through vent 111$h$. The filling metal material 113$i$ can be melted by thermal conduction or thermal radiation. For example, the filling metal material 113$i$ can be melted by a resistance heater (not shown) mounted in the vacuum chamber 21. Alternatively, the filling metal material 113$i$ also can be melted by laser or infrared light. Because the filling metal material 113$i$ and the guiding metal layer 112 are metals, a strong adhesive force occurs between the filling metal material 113$i$ and the guiding metal layer 112, so that the melted filling metal material 113*i* can flow along the guiding metal layer 112.

The gravity can be used for moving the melted filling metal material 113*i*. For example, in the embodiment, the carrier 110 in the vacuum environment V1 is inverted, so that the melted filling metal material 113*i* can be flowed from the second surface 111*b* to the through vent 111*h* by virtue of the gravity. However, in other embodiment, when the through vent 111*h* has a sufficient small diameter, it is not necessary to invert the carrier 110, and the melted filling metal material 113*i* can flow to the through vent 111*h* by capillary action.

Referring to FIG. 2E, afterward, the filling metal material 113*i* is solidified to become the sealing material 113 that seals the through vent 111*h*. So far, the light emitting device 100 is basically complete. In addition, the melting point of the sealing material 113 (equals to the melting point of the filling metal material 113*i*) is higher than the working/operating temperature of the light emitting chip 130, so that the heat generated from the light emitting chip 130 in operation is difficult to melt the sealing material 113. Accordingly, when the light emitting device 100 is working or operating, the sealing material 113, which has a high melting threshold (or in other words, would not likely to melt due to higher melting temperature thereof), can keep on or sustaining to be sealing the through vent 111*h*, so that the water vapor are unable to contact with the light emitting chip 130 when emitting light, so as to keep protecting the light emitting chip 130 from damage caused by water vapor.

Accordingly, when the filling metal material 113*i* is solidified, the filling metal material 113*i* jams or blocks the through vent 111*h*, and the inert gas 140 can be kept within the cavity C1. However, in other embodiment, the cavity C1 can be under a vacuum, so that the step of pumping the inert gas into the vacuum chamber 21 as described in FIG. 2D may be skipped. In other words, when the filling metal material 113*i* is solidified, there can be no gas (e.g. inert gas f140) in the cavity C1. That is, the cavity C1 is under a vacuum.

It is worth mentioning that the method of manufacturing the light emitting device 100 as illustrated in FIG. 2A to FIG. 2E uses the vacuum chamber 21, but the step of disposing the covering part 120 on the carrier 110 is performed under atmospheric environment, so that joining the covering part 120 and the carrier 110 would not be performed in the vacuum environment V1. That is, the vacuum chamber 21 used in the steps shown in FIGS. 2C-2E is not necessary to has large amount of space for moving and joining the covering part 120 and the carrier 110. Hence, the amount of space in the vacuum chamber 21 can be smaller than the amount of space taken up in a larger conventional vacuum chamber. Therefore, compared with prior art, the method of manufacturing the light emitting device 100 can be performed in a small or medium-sized vacuum chamber rather than a large vacuum chamber.

Figure 3:
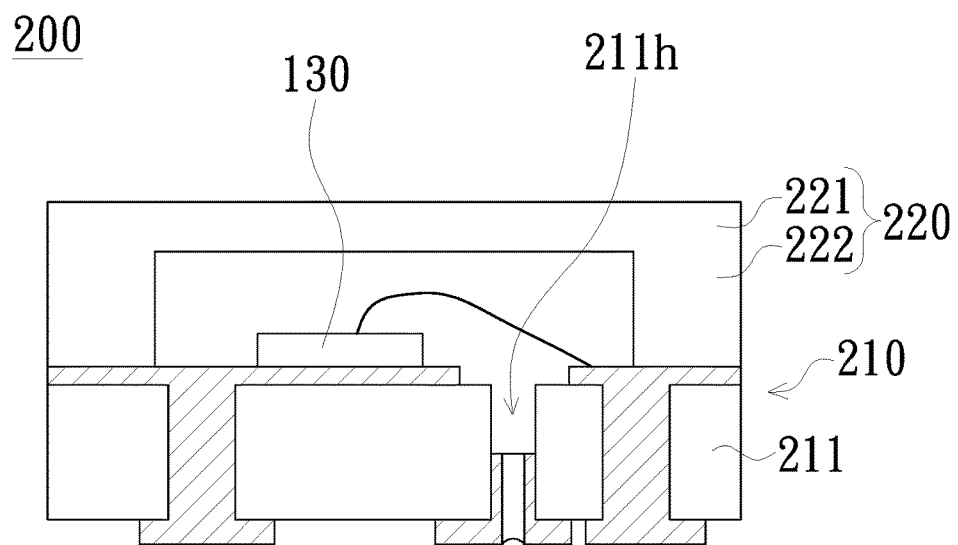
FIG. 3 is a cross-sectional view of a light emitting device according to an another embodiment of the present invention.

Refer to FIG. 3, which illustrates a light emitting device 200 according to another embodiment of present invention. The light emitting device 200 illustrated in FIG. 3 is similar to the light emitting device 100 illustrated in FIG. 1. For example, the methods of manufacturing both the light emitting devices 200 and 100 are the same, and the light emitting device 200 also includes a carrier 210, a covering part 220, and a light emitting chip 130, in which the relative positions and the connections of these elements are all the same of the light emitting device 100. The following description mainly describes the difference between the light emitting devices 100 and 200. The same features and methods of manufacturing are both not described again and illustrated in the drawings in principle.

One difference from the covering part 120 in the embodiment of FIG. 1 is that the covering plate 221 and the supporting frame 222 included by the covering part 220 are integrally-formed into one piece in the embodiment of FIG. 3. That is, the covering plate 221 and the supporting frame 222 both may consist of the same material and be made by the same process. For example, the covering plate 221 and the supporting frame 222 can be made by the same injection molding. Alternatively, the covering part 220 can be made of a plate that is processed by chemical etching or machining, in which the plate may be a glass plate or a plastic plate (e.g. Acrylic plate) for example. Thus, no boundary appears between the covering plate 221 and the supporting frame 222. When the light emitting chip 130 is an infrared light source, the covering part 220 may be opaque, and made of a plastic plate, but the infrared light from the light emitting chip 130 can pass through the covering part 220 entirely. Moreover, the covering part 120 in FIG. 1 and the covering part 220 in FIG. 3 can be exchanged. In other words, the covering parts 120 and 220 can be used in at least one of the light emitting devices 100 and 200.

In addition, the carrier 210 as shown in FIG. 3 is different from the carrier 110 as shown in FIG. 1. Specifically, in the embodiment of FIG. 3, the carrier 210 includes a board 211 also having a through vent 211*h*, which is similar to the through vent 111*h* in FIG. 1. However, the through vent 211*h* has a constant diameter. That is, the through vent 211*h* has no concave H22 as shown in FIG. 1. Moreover, it is worth mentioning that in the light emitting device 100 of FIG. 1, the through vent 111*h* also can be replaced by the through vent 211*h* as shown in FIG. 3. In other words, the board 111 in FIG. 1 may have a through vent 211*h* as shown in FIG. 3 in an alternative embodiment.

Figure 4:
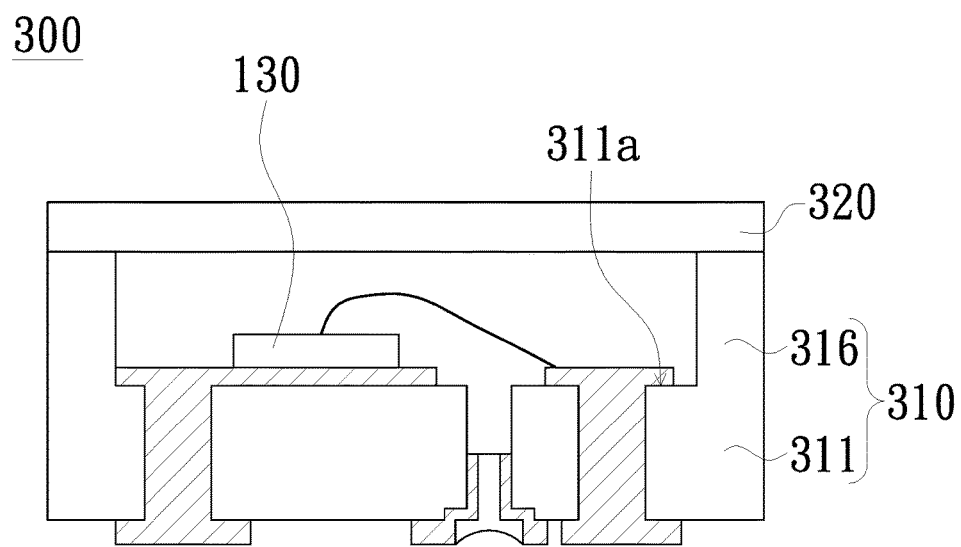
FIG. 4 is a cross-sectional view of a light emitting device according to another embodiment of the present invention.

Refer to FIG. 4, which illustrates a light emitting device 300 according to another embodiment of invention. The light emitting device 300 shown in another embodiment of FIG. 4 is similar to the light emitting device 100 shown in the embodiment of FIG. 1. For example, the methods of manufacturing the light emitting devices 300 and 100 are the same, and the light emitting device 300 also includes a carrier 310, a covering part 320, and a light emitting chip 130, in which the relative corresponding positions and the connections of these elements are all the same as those of the light emitting device 100. The following description mainly describes the difference between the light emitting devices 100 and 300. The same features and methods of manufacturing are both not described again and illustrated in the drawings in principle.

The main difference between the light emitting devices 300 and 100 is the carrier 310. Comparing FIG. 1 and FIG. 4, the carrier 310 is certainly different in shape thereof from that of the carrier 110, which is in the shape of a plate as shown in FIG. 1. In detail, the carrier 310 includes a board 311 and a supporting frame 316. The supporting frame 316 protrudes from a first surface 311*a* of the board 311 and surrounds the light emitting chip 130. The supporting frame 316 is fixed between the board 311 and the covering part 320. The board 311 and the supporting frame 316 may be integrally formed into one piece. In other words, the board 311 and the supporting frame 316 both may consist of the same material and be made by the same process. For example, the board 311 and the supporting frame 316 can be made by ceramic sintering. Thus, no (surface) boundary appears or exists between the board 311 and the supporting frame 316. Moreover, the carriers 110 and 210 shown in FIG. 1 and FIG. 3, respectively, may be replaced by the carrier 310 shown in FIG. 3, so that the carrier 310 shown in FIG. 4 can be used in the light emitting devices 100 and 200 shown in FIG. 1 and FIG. 3.

There is another difference between the light emitting devices 300 and 100, where another difference is the covering part 320. Specifically, the covering part 320 is a plate with two flat sides and transparent. For example, the covering part 320 can be a glass plate or an acrylic plate. Certainly, the covering part 320 also may be opaque and allow passage through entirely by infrared light, like the covering part 220 described in another embodiment of FIG. 3, so that the covering part 320 is not limited to being transparent. Moreover, the covering part 320 also may be a lens, for example a convex lens or a concave lens. The covering plate 121 shown in FIG. 1 and the covering plate 320 shown in FIG. 4 can be exchanged. That is, either one of the covering part 320 or the covering plate 121 can be used in at least one of the light emitting devices 100 and 300.

Based on the above description, the air within the cavity in the light emitting device can be exhausted via the through vent, and the sealing material can be used for sealing the through vent. Accordingly, the sealing material not only can stop water vapor in the environment from entering the cavity via the through vent, but also can keep the cavity under a vacuum, a noble gas atmosphere, a nitrogen atmosphere, or an atmosphere where nitrogen and noble gas are mixed, thereby protecting the light emitting chip from damage caused by water vapor. In addition, the method of manufacturing the light emitting device according to the embodiments of the present invention can be performed in a small or medium-sized vacuum chamber (referring to FIG. 2C to FIG. 2D) without the large vacuum chamber. Compared with prior art, the method of manufacturing the light emitting device according to the embodiment of the invention has an advantage of low manufacturing cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A light emitting device, comprising:
a carrier comprising:
  a board, having a first surface and a second surface, the second surface is opposite to the first surface, and a through vent, wherein the through vent is divided into a first partial hole and a second partial hole, the second partial hole being connected to the first partial hole, wherein the first partial hole extends from the first surface of the board to the second partial hole, whereas the second partial hole extends from the second surface of the board to the first partial hole;
  a guiding metal layer, formed on the second surface of the board and in the second partial hole of the through vent, and covering a sidewall of the second partial hole, wherein the guiding metal layer extends from the second partial hole to the second surface of the board, and does not cover a sidewall of the first partial hole and the first surface of the board;
  a sealing material, filling and sealing the second partial hole, wherein the guiding metal layer surrounds the sealing material;
a wiring layer, formed on the first surface of the board;
a light emitting chip, mounted on the first surface of the board and electrically-connected to the wiring layer; and
a covering part, disposed on the carrier, wherein a cavity is formed between the covering part and the board, and the light emitting chip is located within the cavity.

2. The light emitting device of claim 1, wherein the second partial hole has a concave and a connective hole, the concave extends from the second surface of the board to the connective hole, and the connective hole extends from a bottom of the concave to the first partial hole.

3. The light emitting device of claim 2, wherein the guiding metal layer covers a sidewall of the connective hole and a sidewall of the concave.

4. The light emitting device of claim 1, the sealing material touches the guiding metal layer.

5. The light emitting device of claim 1, wherein the sealing material is metal.

6. The light emitting device of claim 1, wherein the covering part has a holding recess, and the holding recess and the board define the cavity.

7. The light emitting device of claim 1, wherein the carrier comprises a supporting frame protruding from the first surface of the board and surrounding the light emitting chip, and the supporting frame fixed between the board and the covering part.

8. The light emitting device of claim 1, wherein the covering part comprises:
a covering plate; and
a supporting frame, surrounding the light emitting chip, and fixed between the board and the covering plate.

9. The light emitting device of claim 8, wherein the covering plate is transparent.

10. The light emitting device of claim 8, wherein the covering plate is opaque.

11. The light emitting device of claim 1, wherein the light emitting chip is an infrared light source, a visible light source, or an ultraviolet light source.

12. The light emitting device of claim 1, further comprising an inert gas filling the cavity, wherein the inert gas is selected from the group consisting of noble gas and nitrogen.

13. The light emitting device of claim 1, wherein a vacuum is formed in the cavity.

14. A method of manufacturing a light emitting device, comprising:
providing a carrier having a first surface and a second surface, the second surface is opposite to the first surface, a through vent extending from the first surface to the second surface of the carrier, and a guiding metal layer, wherein the guiding metal layer extends from an inside of the through vent to the second surface of the carrier;
mounting a light emitting chip on the first surface of the carrier;
after mounting the light emitting chip, disposing a covering part on the carrier, wherein a cavity is formed between the covering part and the carrier, and the light emitting chip is located within the cavity;
forming a filling metal material on the guiding metal layer, wherein the filling metal material does not seal the through vent;
exhausting a gas within the cavity via the through vent in the carrier;

melting the filling metal material, so as to cause the filling metal material to flow along the guiding metal layer to the through vent; and solidifying the filling metal material, so that the filling metal material seals the through vent.

15. The method of claim 14, wherein exhausting the gas within the cavity comprises placing the carrier and the covering part in a vacuum environment formed within a vacuum chamber.

16. The method of claim 15, further comprising pumping an inert gas into the vacuum chamber, so as to cause the inert gas to enter the cavity via the through vent in the carrier.

17. The method of claim 16, wherein the inert gas fills the cavity when the filling metal material is solidified.

18. The method of claim 14, wherein a vacuum is formed in the cavity when the filling metal material is solidified.

19. The method of claim 14, further comprising inverting the carrier, so as to cause the second surface to face upward before the filling metal material is melted.

* * * * *